(12) United States Patent
Van Duyn

(10) Patent No.: US 7,044,620 B2
(45) Date of Patent: May 16, 2006

(54) LED ASSEMBLY WITH REVERSE CIRCUIT BOARD

(75) Inventor: Paul D. Van Duyn, Anderson, IN (US)

(73) Assignee: Guide Corporation, Pendleton, IN (US)

( * ) Notice: Subject to any disclaimer, the term of this patent is extended or adjusted under 35 U.S.C. 154(b) by 83 days.

(21) Appl. No.: 10/836,479

(22) Filed: Apr. 30, 2004

(65) Prior Publication Data

US 2005/0243558 A1 Nov. 3, 2005

(51) Int. Cl.
*F21V 29/00* (2006.01)

(52) U.S. Cl. ............... 362/294; 362/227; 362/235; 362/245; 362/373; 362/543

(58) Field of Classification Search ................ 362/294, 362/227, 235, 245, 373, 543, 545, 547, 800; 361/717–719, 704, 760, 761
See application file for complete search history.

(56) References Cited

U.S. PATENT DOCUMENTS

| | | | | |
|---|---|---|---|---|
| 4,563,725 A | * | 1/1986 | Kirby | ........................... 361/708 |
| 4,956,753 A | | 9/1990 | Renfrew | |
| 4,959,761 A | * | 9/1990 | Critelli et al. | .............. 362/646 |
| 5,119,174 A | | 6/1992 | Chen | |
| 5,122,943 A | | 6/1992 | Pugh | |
| 5,857,767 A | * | 1/1999 | Hochstein | ................... 362/294 |
| 5,953,210 A | * | 9/1999 | Lo | .............................. 361/704 |
| 6,152,590 A | | 11/2000 | Fürst et al. | |
| 6,325,552 B1 | * | 12/2001 | Brillhart | ...................... 385/88 |
| 6,428,189 B1 | * | 8/2002 | Hochstein | ................... 362/373 |
| 6,508,563 B1 | | 1/2003 | Parker et al. | |
| 6,575,611 B1 | | 6/2003 | Kugler et al. | |
| 2001/0009510 A1 | | 7/2001 | Lodhie | |
| 2002/0034081 A1 | | 3/2002 | Serizawa | |
| 2002/0097579 A1 | | 7/2002 | Stalions | |
| 2002/0140080 A1 | | 10/2002 | Waitl et al. | |
| 2003/0123260 A1 | | 7/2003 | Aynie et al. | |
| 2003/0165061 A1 | * | 9/2003 | Martineau | ................... 362/297 |
| 2003/0168720 A1 | * | 9/2003 | Kamada | ..................... 257/666 |

FOREIGN PATENT DOCUMENTS

JP 244508 9/2001

* cited by examiner

*Primary Examiner*—Sandra O'Shea
*Assistant Examiner*—Mark Tsidulko
(74) *Attorney, Agent, or Firm*—Ice Miller LLP

(57) ABSTRACT

A lamp assembly and methods of assembling the lamp assembly are provided. The lamp assembly comprises a printed circuit board (PCB) having a face surface, a rear surface opposite the face surface, electrical traces on the rear surface, and an opening extending from the face surface to the rear surface, and a light emitting diode (LED) emitter having a dome portion, a body, and a plurality of electrical terminals connected to the body, wherein the body of the LED emitter is adjacent the rear surface, the dome portion of the LED emitter extends through the opening in the PCB to the face surface, and the electrical terminals are connected to the electrical traces on the rear surface.

19 Claims, 6 Drawing Sheets

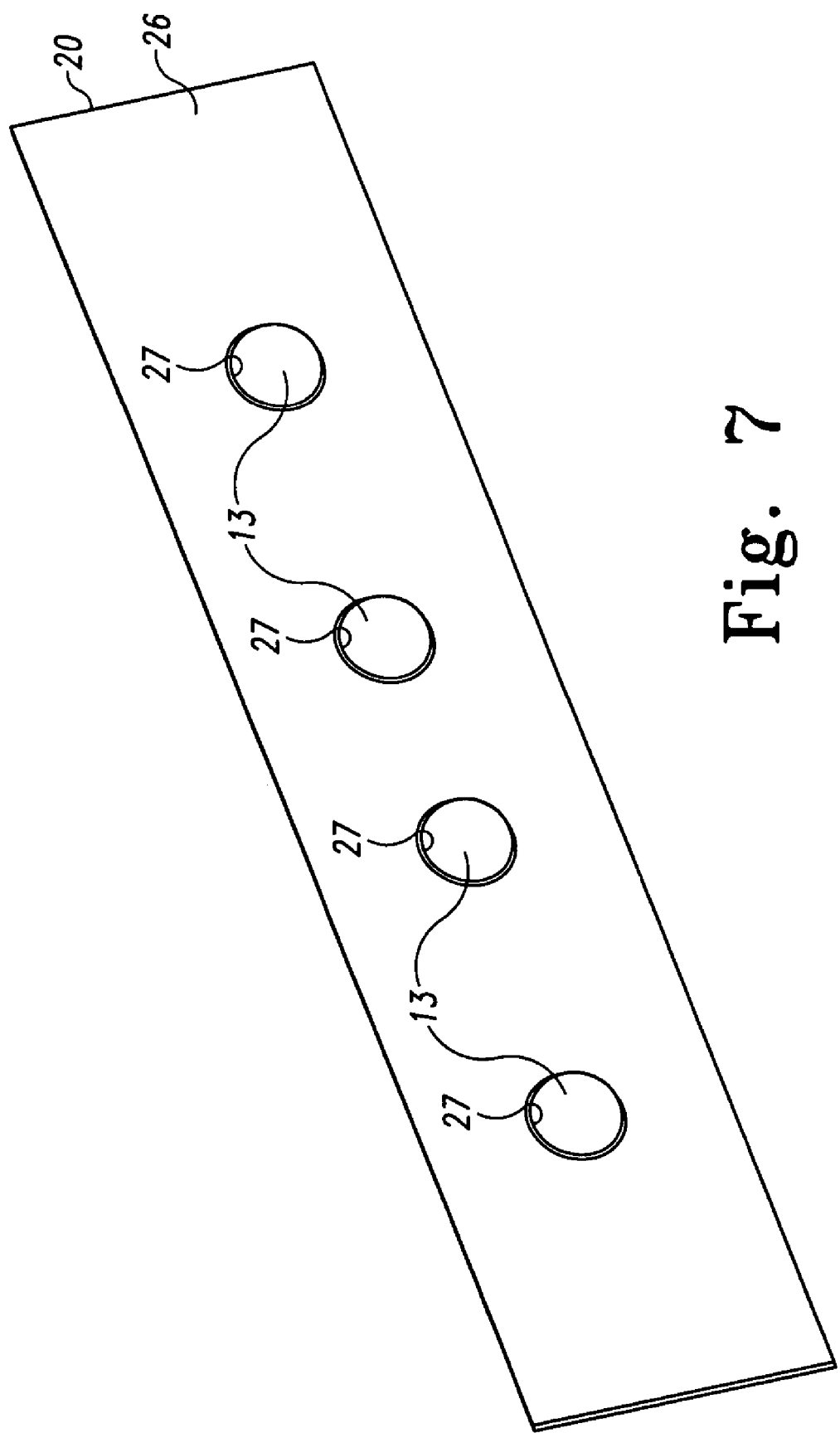

US 7,044,620 B2

LED ASSEMBLY WITH REVERSE CIRCUIT BOARD

BACKGROUND

The present invention relates generally to a lamp assembly, illustratively for use in an automotive vehicle. In particular, the present invention relates to a headlamp or tail lamp including a light emitting diode as the light source.

Light emitting diodes (LEDs) are becoming increasingly important in vehicle headlamp and tail lamp applications. LEDs are smaller than incandescent bulbs and use less energy. In addition, LEDs have a longer life than standard incandescent light bulbs. Accordingly, use of LEDs in automotive headlamps and tail lamps can provide significant energy savings, increased lamp life, smaller lamp size, and flexibility in the design. For these reasons, automobile manufacturers are increasingly interested in unique headlamp and tail lamp designs incorporating LEDs that may also have appeal to automobile customers.

LEDs are often attached directly to electrical traces on a printed circuit board (PCB). Aesthetically, it would be desirable for the dome portion of the LED to be visible, while the rest of the LED and the electrical traces on the PCB are hidden from view. Furthermore, it would be desirable to have an LED assembly with a thin PCB. Such a thin PCB would minimize blockage of light rays from the LED emitter, allowing for rays to pass in a broad conical manner about the emitter's optical axis.

SUMMARY

Accordingly, a lamp assembly is provided comprising a printed circuit board (PCB) having a face surface, a rear surface opposite the face surface, electrical traces on the rear surface, and an opening extending from the face surface to the rear surface, and one or more light emitting diode (LED) emitters, each having a dome portion, a body, and a plurality of electrical terminals connected to the body, wherein the body of each LED emitter is adjacent the rear surface, the dome portion of the LED emitter extends through the opening in the PCB to the face surface, and the electrical terminals are connected to the electrical traces on the rear surface. In an illustrative embodiment, the opening is sized to be only slightly wider than dome portion, and the dome portion is the only portion of the LED emitter readily visible from the face surface of the PCB. Because the electrical traces are provided on the rear surface, the electrical traces are hidden as well. The lamp assembly may further comprise a heat sink.

Methods of assembling an LED lamp assembly are also provided, the methods comprising the steps of providing an assembly fixture having a support surface, placing a printed circuit board (PCB) into the assembly fixture, the PCB having a face surface, a rear surface opposite the face surface, electrical traces on the rear surface, and an opening extending from the face surface to the rear surface, the face surface placed against the support surface, providing a light emitting diode (LED) having a dome portion, a body, and a plurality of electrical terminals, placing the dome portion through the opening in the PCB, with the body remaining adjacent the rear surface of the PCB, and attaching the electrical terminals to the electrical traces to create the LED lamp assembly. When a heat sink is used, the methods further comprise the steps of placing the PCB on to the heat sink and fixing the PCB and heat sink assembly into an automotive lamp fixture.

These and other advantages and features of the present invention shall hereinafter appear, and for the purposes of illustration, but not limitation, exemplary embodiments of the present invention shall hereinafter be described.

BRIEF DESCRIPTION OF THE DRAWINGS

FIG. 7 is a top perspective view of the LED assembly of FIG. 6.

DESCRIPTION

Figure 1:
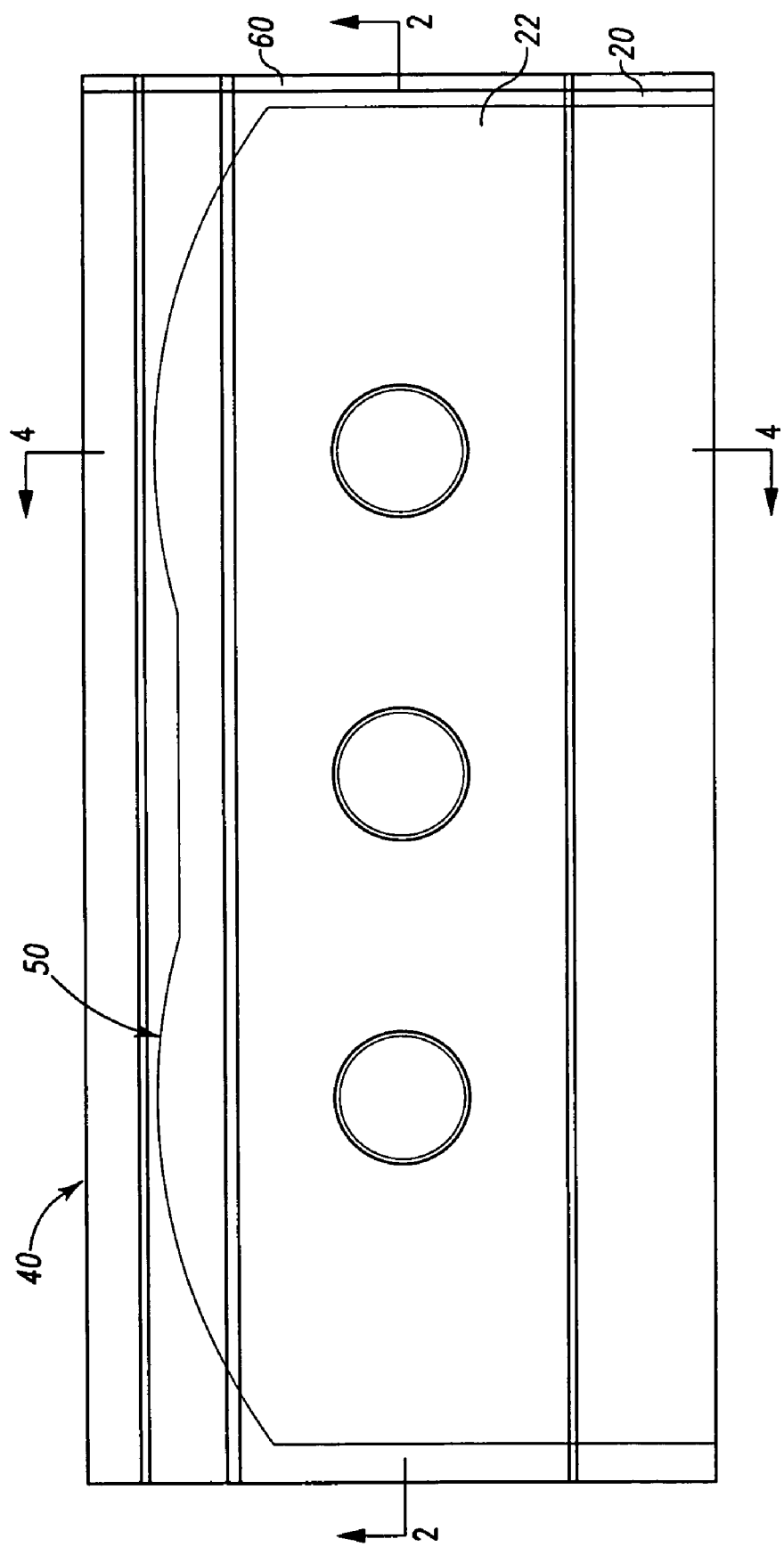
FIG. 1 shows a top view of an LED assembly.
Figure 2:
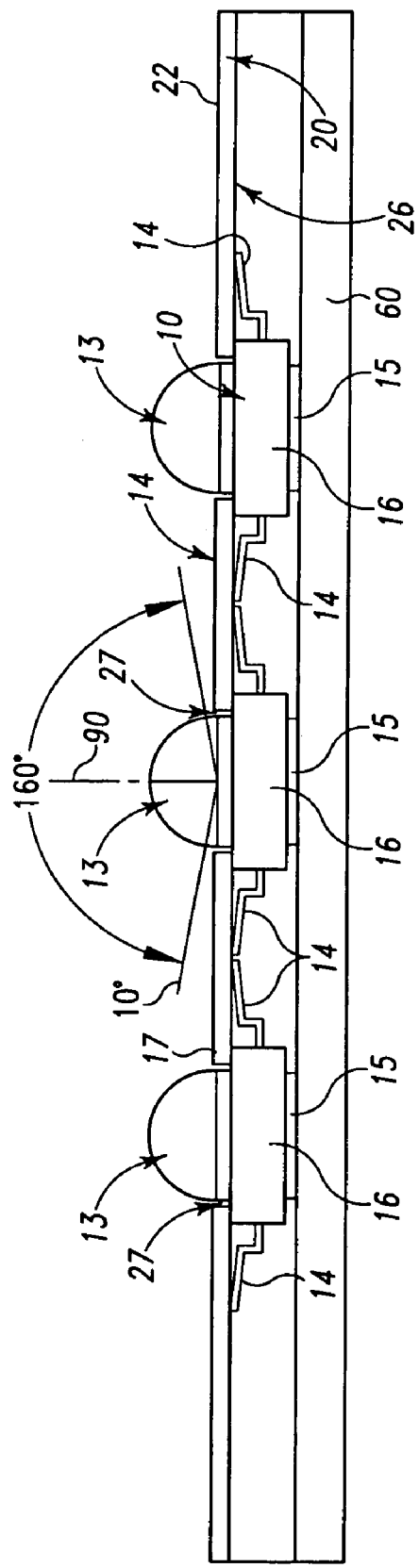
FIG. 2 shows a cross section of the LED assembly of FIG. 1 through line 2—2.
Figure 3:
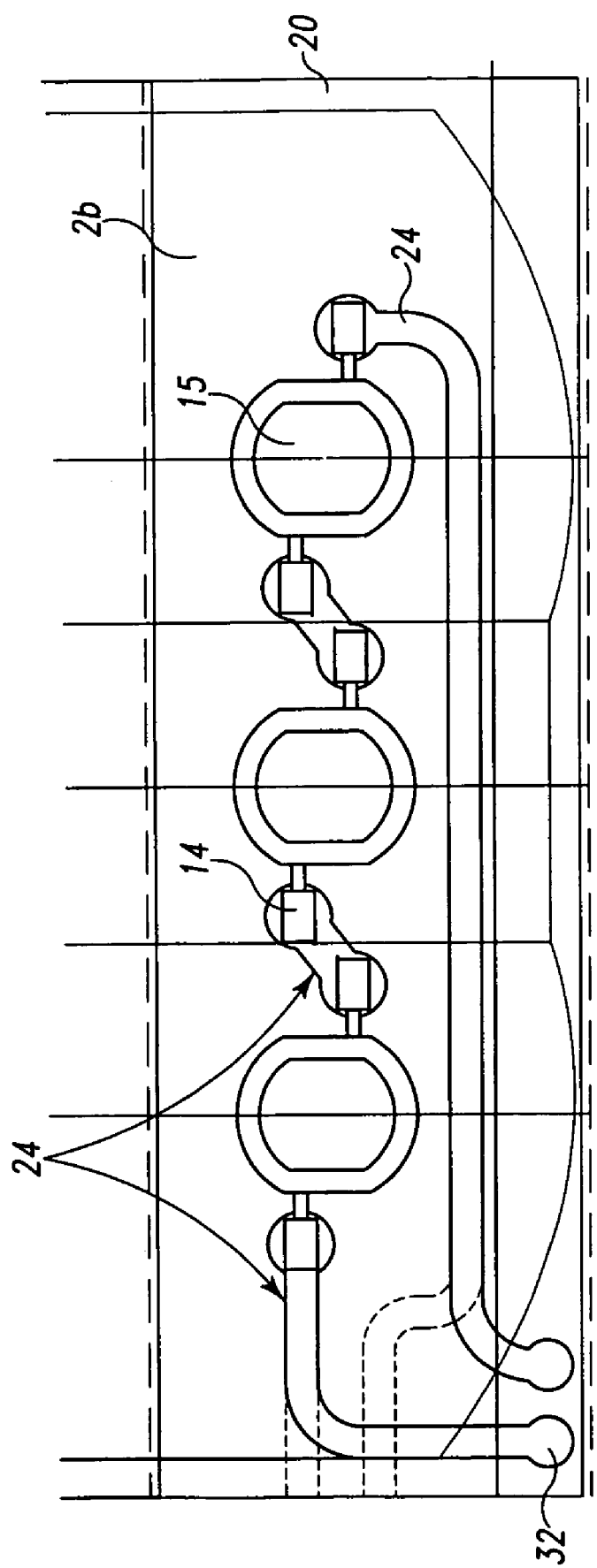
FIG. 3 shows a bottom view of the LED assembly of FIG. 1.

With reference to FIGS. 1–3, an LED assembly comprises a plurality of LED emitters 10 placed on a printed circuit board (PCB) 20. The PCB 20 includes a plurality of openings 27 through its face 22, each opening 27 dimensioned to receive a dome portion 13 (i.e., lens) of an LED emitter 10. As best seen in FIG. 2, each illustrative LED emitter 10 includes a dome portion 13, a body portion 16, electrical terminals 14, and a heat slug 15. The electrical terminals 14 are "reverse" electrical terminals that extend upward, toward the rear surface 26 of the PCB 20 and the LED dome portion 13, as opposed to a standard terminal position of downward, toward the heat slug 15 of the LED emitter 10. As best seen in FIG. 3, the PCB 20 includes electrical traces 24 on its rear surface 26. The result is an assembly 40, as shown in FIG. 1, having a clean and uncluttered appearance, wherein only dome portions 13 of the LED emitters show through PCB 20. Electrical traces 24, which are provided on rear surface 26, are also hidden from view.

As shown in FIG. 2, the body portion 16 of each LED emitter 10 sits below the PCB 20, while the dome portion 13 extends through its respective lens opening 27. In the illustrative embodiment, lens opening 27 is sized to be only slightly wider than dome portion 13. Thus, only the dome portion 13 of the LED emitter 10 is easily visible through the PCB 20. A gap 29 between opening 27 and dome portion 13 is minimal, with either very little or none of top surface 17 of body portion 16 being visible.

As shown in FIG. 1, the lens openings 27 in the PCB 10 need only to be large enough to permit a lens to be placed in or through the opening. This small hole reduces or eliminates viewing of any lamp component other than the lens or dome portion, when viewed from the face 22 of the PCB. It is understood, however, that LED emitters are available in various shapes and sizes, with various shaped dome portions, and lens opening 27 may be shaped and sized accordingly. Also, in some circumstances, it may be desirable to view at least a small portion of the top surface 17 of body portion 16 of the LED emitter, and opening 27 may be sized accordingly. Further, it may be desirable to have openings 27 sized for a maximum sized LED emitter, but then use PCB 20 with a variety of sizes of LED emitters.

When emitters having smaller dome portions are used, some of top surface 17 of body portion 16 may be visible.

As seen in FIG. 3, the electrical terminals 14 of LED emitter 10 are attached to the electrical traces 24 on the rear surface 26 of the PCB 20. The electrical terminals 14 may be soldered to the electrical traces 24, or may be connected to the electrical traces 24 by any method, as is known in the art. Because the electrical terminals 14 are attached on the backside of the PCB 10, the electrical terminals 14 and the electrical traces 24 are hidden from view. A connector 34 on PCB 10 provides an electrical connection to connect the assembly to other devices, illustratively to the electrical system of an automobile.

Figure 4:
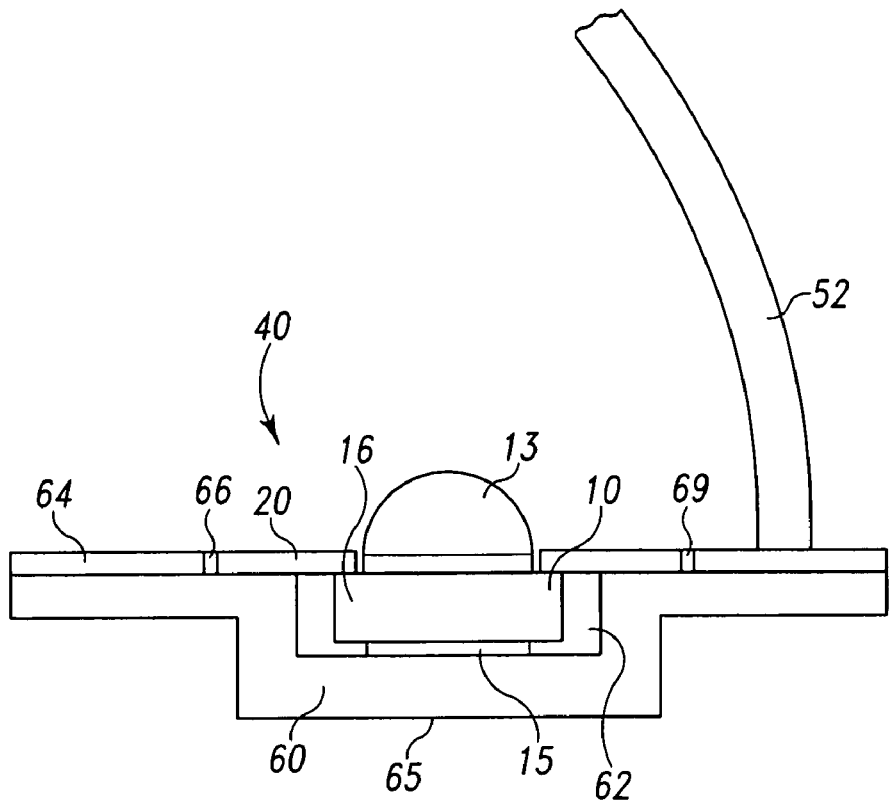
FIG. 4 shows another cross section of the LED assembly of FIG. 1 through line 4—4.

FIG. 4 shows a cross section through an LED emitter of the assembly 40 of FIG. 1 at line 4—4. As illustrated, the LED emitter 10 sits in a first recess 62 in heat sink 60 which forms a channel in the heat sink. PCB 20 sits in a second recess 66 in the face 64 of heat sink 60 which is formed along the edges of the channel. FIG. 4 also shows a reflector 52 extending away from the assembly in an arcuate fashion. Such a reflector may be included to direct light emitted from the LEDs in a desired direction relative to the PCB (e.g., sideways). An illustrative reflector footprint 50 is shown in FIG. 1.

Figure 5:
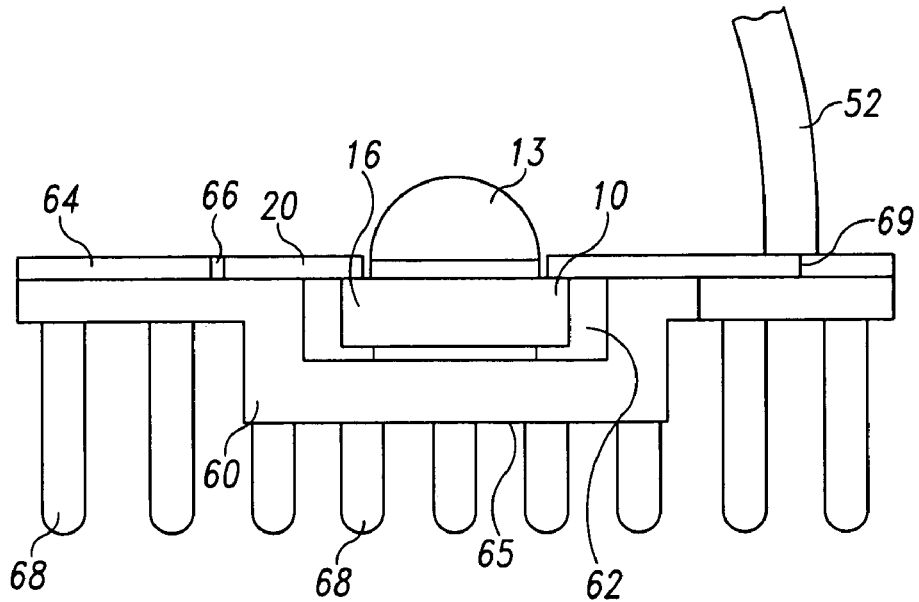
FIG. 5 is similar to FIG. 4, showing an alternative configuration of an LED assembly.

Because many LED emitters have high heat output, these LED emitters may require additional thermal management. Thus, as shown in FIG. 5, heat sink 60 may be provided with a plurality of fins 68. As illustrated, fins 68 extend from rear surface 65 of heat sink 60. It is understood that the number and placement of fins 68 may be dictated by the number, placement, and heat output of the LED emitters 10. Alternatively, the arrangement of fins 68 may be chosen for aesthetic or other considerations. Various other arrangements are possible within the scope of this invention.

FIG. 5 also shows an alternative arrangement of the PCB 20 and heat sink 60. As shown, second recess 66 in face 64 of heat sink 60 extends all the way to reflector 52. Similarly, PCB 20 also extends to reflector 52. Thus, join line 69 between PCB 20 and heat sink 60 is not visible. It is understood that other arrangements are possible, depending on how much of the face of PCB 20 and of the heat sink 60 it is designed to be visible. Such decisions may be purely aesthetic, or may be functional, for example if a large heat sink is necessary.

In one embodiment, the PCB 20 is thin, illustratively no more than 0.6 mm thick. A thin PCB 20 is advantageous as the thinner the PCB, the less blockage of light rays occurs around dome portion 13. In the illustrative embodiment shown in FIG. 2, the provision of a thin PCB eliminates the blockage of light rays emitted in a broad, illustratively 160°, conical (total included angle) manner about the emitter's optical axis 90 which is centered and perpendicular to its body and lens seating planes. However, it is understood that other thicknesses of PCB 20 are possible, with resultant alteration in the blockage of light rays. Illustratively, in some applications it may be acceptable to have light rays in only a 120° conical manner, and a thicker PCB 20 may be used. A frustoconical bore in opening 27 may also provide for broad conical emission, even when a thicker PCB is used.

Thin printed circuit boards are often very flexible. When a PCB is flexed or bent, this movement can stress soldered attachments. Depending on the application, a thicker more rigid PCB could be used, but, depending on the LED emitter design, a thicker PCB may result in peripheral light blockage, reducing the optimal use of available light from each emitter. It is a normal requirement for a PCB to be sufficiently thick to assure rigidity due to the potential flexing of the PCB during the assembly sequence, including attaching the LED emitters to the outer surface of a PCB and then assembling the PCB/emitter assembly to a heat sink. The rigidity allows assembly without fracturing solder joints or components.

The LED assembly may be easily assembled by first inserting the dome of each LED into one of the openings 27 of the PCB. The terminals 14 of the LEDs are then joined to the electrical traces on the printed circuit board through soldering or any other means known in the art. In the illustration shown in FIG. 3, the LEDs are connected in series, but it will be apparent that the LEDs may be connected in parallel or in completely different circuits on the PCB. Adhesive may be used upon the upper part of the body portion 16 of the LED where the body portion is adjacent to the PCB if additional support for the LED upon the PCB is desired. With the LEDs physically and electrically connected to the PCB, the PCB is placed upon the heat sink 60. PCB 20 and heat sink 60 may be provided with holes, and pins can be used to assure proper alignment. Other means for providing proper alignment may also be employed. As shown in FIGS. 4 and 5, when the PCB 20 is placed upon the heat sink 60, each LED heat slug 15 contacts the heat sink in the first recess and the reverse side of the PCB contacts and seats in the second recess 66. Adhesives or other materials known in the art may be used to securely fasten and secure the PCB to the heat sink. A heat conducting adhesive or other material may also be used to connect the heat slug 15 of the LEDs to the heat sink 60. Thereafter, reflector 52 may be added to the LED assembly before the LED is placed in the automotive light fixture designed for the LED assembly. The fixture may comprise any number of different lighting fixtures known in the industry, including standard lamp cavities with reflectors and/or lenses as well as solid acrylic or glass fixtures where light is refracted and/or reflected within medium and piped to a desired output.

Figure 6:
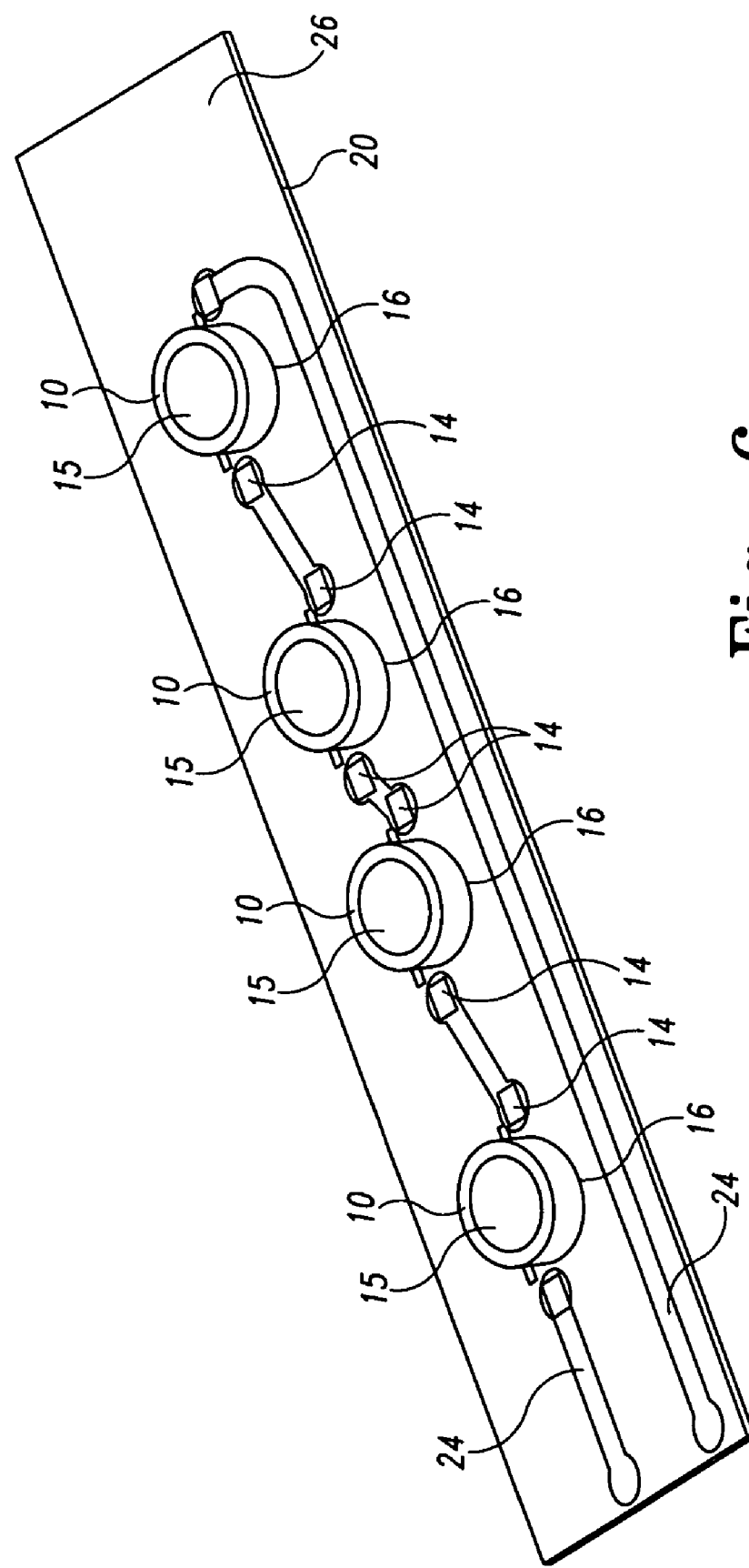
FIG. 6 is a bottom perspective view of an LED assembly having four emitters.

FIGS. 1–3 show an embodiment of the LED assembly 40 having three LED emitters 10. It is understood that other arrangements are possible, with other numbers and positioning of emitters, including a single emitter. FIGS. 6–7 show perspective views of a LED assembly having four emitters 10. FIG. 6 shows a bottom view of a PCB 20. Four LED emitters 10 are shown, with body portions 15 adjacent rear surface 26 of PCB 20. Each LED emitter 10 has a pair of electrical terminals 14 extending toward surface 26 of PCB 20, each electrical terminal 14 operably connected to the electrical traces 24 on rear surface 26 of PCB 20. While the illustrative examples are all shown a having two electrical terminals per LED emitter, it is understood that other arrangements are possible, depending on application, as is known in the art. As illustrated, for each LED emitter 10, a heat slug 15 extends away from rear surface 26. A heat sink 60 (not shown in FIG. 6) may be provided, illustratively in contact with the heat slugs 15. FIG. 7 shows the face 22 of PCB 20. Four light domes 13 extend through the four openings 27 in PCB 20. No other portions of the LED emitters are visible.

The design provides for a very clean uncluttered appearance with only the emitter lenses being exposed on the face of the PCB. If a reflector 52 is mounted on the PCB, such as that shown in FIGS. 4 and 5 the reflector does not reflect other portions of the LED other than the dome lens, thus providing for an aesthetically pleasing appearance. The assembly is also very minimal from a size standpoint, having a low profile which may be beneficial from a space or component packaging standpoint. The usage of multiple light sources within one simple assembly simplifies emitter electrical and thermal interfaces and permits simultaneous attachment and focusing of multiple light sources.

Although the invention has been described in detail with reference to certain preferred embodiments, variations and modifications exist within the scope and spirit of the invention as described and defined in the following claims.

The invention claimed is:

1. A lamp assembly comprising:
a printed circuit board (PCB) having a face surface, a rear surface opposite the face surface, electrical traces on the rear surface, and an opening extending from the face surface to the rear surface, the PCB configured to permit passage of light rays in a 160° conical manner about an optical axis of a light emitting diode (LED) emitter,
the light emitting diode LED emitter having a dome portion extending through the opening in the PCB to the face surface, a body adjacent to the rear surface, at least one electrical terminal connected to the body and the electrical traces on the rear surface, and the optical axis that extends away from the body and through the dome portion.

2. The lamp assembly of claim 1 further comprising
a heat slug connected to the body of the LED emitter, and
a heat sink having a portion adjacent the rear surface of the PCB and in contact with the heat slug.

3. The lamp assembly of claim 1 wherein the heat sink is provided with a plurality of fins.

4. The lamp assembly of claim 1 wherein the opening is sized to be only slightly wider than dome portion, and the dome portion is the only portion of the LED emitter readily visible from the face surface of the PCB.

5. The lamp assembly of claim 4 wherein the PCB is no more than 0.6 mm thick.

6. The lamp assembly of claim 1 wherein the PCB has a plurality of additional openings extending from the face surface to the rear surface, and further comprising a plurality of additional LED emitters, each additional LED emitter having a dome portion, a body, and a plurality of electrical terminals connected to the body, wherein the body of each of the additional LED emitters is adjacent the rear surface, the dome portion of each of the additional LED emitters extends through the opening in the PCB to the face surface, and the electrical terminals of each of the additional LED emitters are connected to the electrical traces on the rear surface.

7. The lamp assembly of claim 6 wherein each opening is sized to be only slightly wider than each respective dome portion, and the dome portions are the only portions of the LED emitters readily visible from the face surface of the PCB.

8. A method of assembling an LED lamp assembly comprising the steps of
providing an assembly fixture having a support surface,
placing a printed circuit board (PCB) into the assembly fixture, the PCB having a face surface, a rear surface opposite the face surface, electrical traces on the rear surface, and an opening extending from the face surface to the rear surface, the face surface placed against the support surface,
providing a light emitting diode (LED) having a dome portion, a body, a plurality of electrical terminals, and an optical axis extending away from the body,
placing the dome portion through the opening in the PCB, with the body remaining adjacent the rear surface of the PCB, so that the PCB permits passage of light rays emitted in a 160° conical manner about the optical axis of the LED, and
attaching the electrical terminals to the electrical traces to create the LED lamp assembly.

9. The method of claim 8 further comprising the steps of:
placing a heat sink into the assembly fixture, and
fixing the heat sink to the LED lamp assembly.

10. The method of claim 8 wherein the PCB is thin, and the heat sink provides rigidity to the structure to minimize fracturing the electrical terminals from the electrical traces.

11. The method of claim 8 wherein the support surface is generally planer and has a recess for receiving a part of the dome portion that extends beyond the face surface of the PCB.

12. The method of claim 8 wherein the assembly fixture has sides configured to provide alignment of the PCB and the heat sink.

13. An automotive lamp assembly comprising:
a printed circuit board having a face surface and a rear surface with at least one hole extending through the printed circuit board from the face surface to the rear surface and with a plurality of electrical traces on the rear surface of the printed circuit board, the printed circuit board configured to permit passage of light rays in a 160° conical manner about an optical axis of at least one light emitting diode (LED);
the at least one LED having a top lens, positioned in the at least one hole and extending through the face surface two electrical terminals connected to the electrical traces on the rear surface of the printed circuit board, and the optical axis extending away from a body adjacent to the rear surface and through the top lens extending through the at least one hole to the face surface.

14. The automotive lamp assembly of claim 13 further comprising a heat sink connected to the at least one LED.

15. The automotive lamp assembly of claim 14 wherein the heat sink includes a first recess for receiving the at least one LED.

16. The automotive lamp assembly of claim 15 further comprising a second recess for receiving the printed circuit board.

17. The automotive lamp assembly of claim 15 wherein at least one LED is secured to the first recess for receiving the at least one LED.

18. The automotive lamp assembly of claim 14 wherein the printed circuit board is secured to the heat sink.

19. The automotive Lamp assembly of claim 13 further comprising a reflector positioned upon the face surface of the printed circuit board.

* * * * *